(12) United States Patent
Park (10) Patent No.: US 11,081,147 B2
(45) Date of Patent: Aug. 3, 2021

(54) PSEUDO-CRYOGENIC SEMICONDUCTOR DEVICE HAVING PSEUDO-CRYOGENIC TEMPERATURE SENSOR AND VOLTAGE SUPPLIER AND PSEUDO-CRYOGENIC SEMICONDUCTOR STACK

(71) Applicant: SK hynix Inc., Gyeonggi-do (KR)

(72) Inventor: Won-Kyung Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 2 days.

(21) Appl. No.: 16/596,319

(22) Filed: Oct. 8, 2019

(65) Prior Publication Data

US 2020/0185011 A1   Jun. 11, 2020

(30) Foreign Application Priority Data

Dec. 6, 2018   (KR) .......................... 10-2018-0155910

(51) Int. Cl.
```
G11C 7/04      (2006.01)
G11C 5/14      (2006.01)
H01L 27/105    (2006.01)
G11C 8/08      (2006.01)
H01L 23/473    (2006.01)
G01K 13/00     (2021.01)
H01L 25/065    (2006.01)
```

(52) U.S. Cl.
CPC ............ *G11C 5/147* (2013.01); *G01K 13/006* (2013.01); *G11C 8/08* (2013.01); *H01L 23/473* (2013.01); *H01L 25/0657* (2013.01); *H01L 27/1052* (2013.01); *H01L 2225/06565* (2013.01); *H01L 2225/06589* (2013.01)

(58) Field of Classification Search
CPC .................................. G11C 5/147; G11C 8/08
USPC ......................................................... 365/211
See application file for complete search history.

(56) References Cited

U.S. PATENT DOCUMENTS

| | | | |
|---|---|---|---|
| 7,383,149 B1 * | 6/2008 | Walker ............... | G01R 31/2874 702/127 |
| 8,497,453 B2 | 7/2013 | Walker | |
| 9,099,196 B2 | 8/2015 | Ryu et al. | |
| 9,195,577 B2 | 11/2015 | Saraswat et al. | |
| 2010/0309715 A1 * | 12/2010 | Choi .................. | G11C 13/0038 365/163 |
| 2014/0369110 A1 * | 12/2014 | Cho .......................... | G11C 7/04 365/149 |
| 2017/0025162 A1 * | 1/2017 | Kim ..................... | G11C 29/021 |

\* cited by examiner

*Primary Examiner* — Vu A Le
(74) *Attorney, Agent, or Firm* — IP & T Group LLP (57) ABSTRACT

A pseudo-cryogenic semiconductor device includes memory cells having a plurality of transistors; and a bulk bias voltage supply circuit configured to provide a bulk bias voltage to be applied to a bulk region of the memory cells. The bulk bias voltage supply circuit includes a first temperature sensing circuit configured to generate a first voltage adjustment signal by sensing a temperature in a range from about 70° K to about 173° K; and a bulk bias voltage selector configured to receive the first voltage adjustment signal, select one of a first bulk bias voltage and a second bulk bias voltage different from the first bulk bias voltage, and output the selected voltage as the bulk bias voltage.

20 Claims, 10 Drawing Sheets

PSEUDO-CRYOGENIC SEMICONDUCTOR DEVICE HAVING PSEUDO-CRYOGENIC TEMPERATURE SENSOR AND VOLTAGE SUPPLIER AND PSEUDO-CRYOGENIC SEMICONDUCTOR STACK

CROSS-REFERENCE TO RELATED APPLICATION

This application claims priority under 35 U.S.C. § 119(a) to Korean Patent Application No. 10-2018-0155910, filed on Dec. 6, 2018, which is incorporated herein by reference in its entirety.

BACKGROUND

1. Field

Various embodiments relate to a pseudo-cryogenic semiconductor device having a temperature sensor, a voltage generator, and/or a voltage selector, and a pseudo-cryogenic semiconductor stack including the pseudo-cryogenic semiconductor device.

2. Discussion of the Related Art

Recently, as the next generation semiconductor device, a cryogenic semiconductor device operating in a cryogenic temperature range has been proposed. The cryogenic semiconductor device has excellent characteristics such as high speed operation, low power consumption, fine patterning, improved integration degree, increased data retention time, and an extended refresh cycle. However, since the cryogenic semiconductor device operates in the cryogenic temperature range, a threshold voltage of a transistor may increase, operation speed may be slowed due to excessive voltage swing, and power consumption may increase. Thus, a pseudo-cryogenic semiconductor device capable of stably operating in a pseudo-cryogenic temperature range is needed.

SUMMARY

Various embodiments are directed to a pseudo-cryogenic semiconductor device including a voltage supplier which provides boosted or reduced voltages according to temperature and has a temperature sensor, a voltage generator, and/or a voltage selector, and a pseudo-cryogenic semiconductor stack.

Also, various embodiments are directed to a pseudo-cryogenic semiconductor device including a voltage supplier which grounds, cuts off, or shuts down a bias voltage according to temperature and has a temperature sensor and a switching unit, and a pseudo-cryogenic semiconductor stack.

In an embodiment, a pseudo-cryogenic semiconductor device may include memory cells having a plurality of transistors; and a bulk bias voltage supply circuit configured to provide a bulk bias voltage to be applied to a bulk region of the memory cells. The bulk bias voltage supply circuit may include a first temperature sensing circuit configured to generate a first voltage adjustment signal by sensing a temperature in a range from about 70° K to about 173° K; and a bulk bias voltage selector configured to receive the first voltage adjustment signal, select one of a first bulk bias voltage and a second bulk bias voltage different from the first bulk bias voltage, and output the selected voltage as the bulk bias voltage.

The first bulk bias voltage may be a negative (−) voltage and the second bulk bias voltage may be a ground voltage.

The bulk bias voltage supply circuit may further include a pre-switching circuit, and the pre-switching circuit may include an on-off switch configured to substantially prevent an initial bulk bias voltage from being provided to the bulk bias voltage selector.

The bulk bias voltage supply circuit may further include a bulk bias voltage generator configured to convert a positive (+) voltage into a negative (−) voltage and provide the converted negative (−) voltage to the bulk bias voltage selector.

The bulk bias voltage supply circuit may further include a bulk bias voltage splitter positioned between output of the bulk bias voltage generator and input of the bulk bias voltage selector, the bulk bias voltage splitter may split the initial bulk bias voltage into a plurality of intermediate bulk bias voltages, and the first bulk bias voltage may be one of the intermediate bulk bias voltages.

The initial bulk bias voltage may be a positive (+) voltage and the plurality of intermediate bulk bias voltages may be negative (−) voltages.

The pseudo-cryogenic semiconductor device may further include a word line bias voltage supply circuit configured to provide a word line bias voltage to be applied to word lines of the memory cells. The word line bias voltage supply circuit may include a word line bias voltage generator configured to convert a single initial word line bias voltage into a plurality of intermediate word line bias voltages; a second temperature sensing circuit configured to generate a second voltage adjustment signal by sensing the temperature in the range from about 70° K to about 173° K; and a word line bias voltage selector configured to receive the second voltage adjustment signal, select one of the intermediate word line bias voltages, and output the selected voltage as the word line bias voltage.

The plurality of intermediate word line bias voltages may be negative (−) voltages.

The word line bias voltage supply circuit may further include a word line bias voltage generator configured to convert a positive (+) voltage into a negative (−) voltage and provide the converted negative (−) voltage to the word line bias voltage selector.

The word line bias voltage supply circuit may further include a word line bias voltage splitter positioned between output of the word line bias voltage generator and input of the word line bias voltage selector. The word line bias voltage splitter may split the initial word line bias voltage into a plurality of intermediate word line bias voltages.

The second temperature sensing circuit may generate second voltage adjustment signals according to a change in a unit temperature set in the temperature range from about 70° K to about 173° K, and the word line bias voltage selector may output the intermediate word line bias voltages having multiple levels according to the second voltage adjustment signals.

In an embodiment, a pseudo-cryogenic semiconductor device may include a memory block having first to fourth memory banks; and a logic block including first to fourth voltage supply circuits coupled with the first to fourth memory banks respectively to independently supply voltages to the first to fourth memory banks. Each of the first to fourth voltage supply circuits may include a temperature sensing circuit configured to generate voltage adjustment signals by sensing a temperature in a range from about 70° K to about 173° K; a first bias voltage supply circuit configured to receive the voltage adjustment signals and supply a first bias voltage to a bulk region of the coupled memory banks; and a first reference voltage supply circuit configured to receive the voltage adjustment signals and supply a first reference voltage to the coupled memory banks. The first reference voltage supply circuit may include a first reference voltage generator configured to generate a first initial reference voltage having a positive (+) value; a first reference voltage splitter configured to receive the first initial reference voltage and generate a plurality of first intermediate reference voltages having a positive (+) value; and a first reference voltage selector configured to select one of the first intermediate reference voltages and outputs the selected voltage as the first reference voltage.

Each of the first to fourth voltage supply circuits may further include a second bias voltage supply circuit configured to receive the voltage adjustment signals and supply a second bias voltage to word lines of the coupled memory banks.

The first bias voltage supply circuit may include a first bias voltage generator configured to generate a first input bias reference voltage having a negative (−) value; and a first bias voltage selector configured to select one of the first input bias reference voltage and a ground voltage and output the selected voltage as the first bias voltage.

The second bias voltage supply circuit may include a second bias voltage generator configured to generate a second input bias voltage having a negative (−) value; a second bias voltage splitter configured to split the second input bias voltage into a plurality of second intermediate bias voltages; and a second bias voltage selector configured to select one of the second intermediate bias voltages and output the selected voltage as the second reference voltage.

The first bias voltage supply circuit may further include a pre-switching circuit configured to shut down the first bias voltage generator by interrupting an internal supply voltage inputted to the first bias voltage generator.

The pseudo-cryogenic semiconductor device may further include a second reference voltage supply circuit configured to receive the voltage adjustment signals and supply a second reference voltage to the logic block. The second reference voltage supply circuit may include a second reference voltage generator configured to generate a second input reference voltage having a positive (+) value; a second reference voltage splitter configured to receive the second input reference voltage and generate a plurality of second intermediate reference voltages having a positive (+) value; and a second reference voltage selector configured to select one of the second intermediate reference voltages and output the selected voltage as the second reference voltage.

In an embodiment, a pseudo-cryogenic semiconductor stack may include a main board; a plurality of semiconductor devices mounted on the main board; and a cooling system configured to cool the plurality of semiconductor devices to a temperature in a range from about 70° K to about 173° K. Each of the semiconductor devices may include voltage supply circuits that operate independently. Each of the voltage supply circuits may include a temperature sensing circuit configured to generate voltage adjustment signals according to the temperature to which plurality of semiconductor devices are cooled, and voltage selectors configured to adjust output voltages according to the voltage adjustment signals.

Each of the semiconductor devices may include first to fourth memory banks; and first to fourth voltage supply circuits respectively coupled with the first to fourth memory banks to independently supply voltages to the first to fourth memory banks. Each of the first to fourth voltage supply circuits may include a temperature sensing circuit configured to generate and output voltage adjustment signals by sensing the temperature in the range from about 70° K to about 173° K; and a voltage supply circuit configured to receive the voltage adjustment signals from the temperature sensing circuit and supply adjusted voltages to the coupled memory banks.

The temperature sensing circuit may generate voltage adjustment signals according to a change in a unit temperature in the temperature range from about 70° K to about 173° K, and the voltage supply circuit outputs the adjusted voltages having multiple levels according to the voltage adjustment signals.

In an embodiment, a voltage supplying circuit for a pseudo-cryogenic semiconductor device may include a temperature sensing circuit suitable for sensing a temperature of the semiconductor device and generating a voltage adjustment signal based on the sensed temperature; a bias voltage generator suitable for receiving an input bias voltage and adjusting the input bias voltage to generate an intermediate bias voltage; and a bias voltage selector suitable for selectively selecting one of the intermediate bias voltage and a ground voltage according to the voltage adjustment signal, and outputting the selected voltage as an output bias voltage.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

Throughout the disclosure, when one element is referred to as being 'connected to' or 'coupled to' another element, it may indicate that the former element is directly connected or coupled to the latter element or electrically connected or coupled to the latter element with one or more other elements interposed therebetween. Furthermore, when an element "includes" or "comprises" a component, it means that one or more other components are not excluded from being included in the element; rather, the element may include or comprise one or more other non-identified components, unless stated or the context requires otherwise. Moreover, a component represented in the singular form is not necessarily limited to only one such component but may include multiple such components depending on the context.

The present disclosure is directed to a pseudo-cryogenic semiconductor device capable of stably operating at a pseudo-cryogenic temperature range. Specifically, embodiments of the present invention provide a pseudo-cryogenic semiconductor device capable of more effectively operating in a pseudo-cryogenic temperature range, which is lower than a normal low temperature environment, that is, in the range of 0° C. to −40° C. In the present disclosure, the pseudo-cryogenic temperature range may refer to a temperature range that may be implemented using liquid nitrogen. For example, the pseudo-cryogenic temperature range may be defined as 77° K±7° K that is close to the vaporization temperature of liquid nitrogen. Since (−204° C. to −189° C.) liquid nitrogen is a relatively inexpensive refrigerant, the pseudo-cryogenic temperature range implemented using liquid nitrogen is a very commercially advantageous temperature range. Semiconductor devices and a semiconductor stack in accordance with embodiments may be designed to exhibit optimum performance over the pseudo-cryogenic temperature range implemented using liquid nitrogen. In other embodiments, the pseudo-cryogenic temperature range may be defined as an extended range. For example, an extended pseudo-cryogenic temperature range may be defined to about 70° K to about 123° K (e.g., −204° C. to −150° C.), and the pseudo-cryogenic temperature range may be further extended and defined to about 70° K to about 173° K (e.g., −204° C. to −100° C.).

Figure 1:
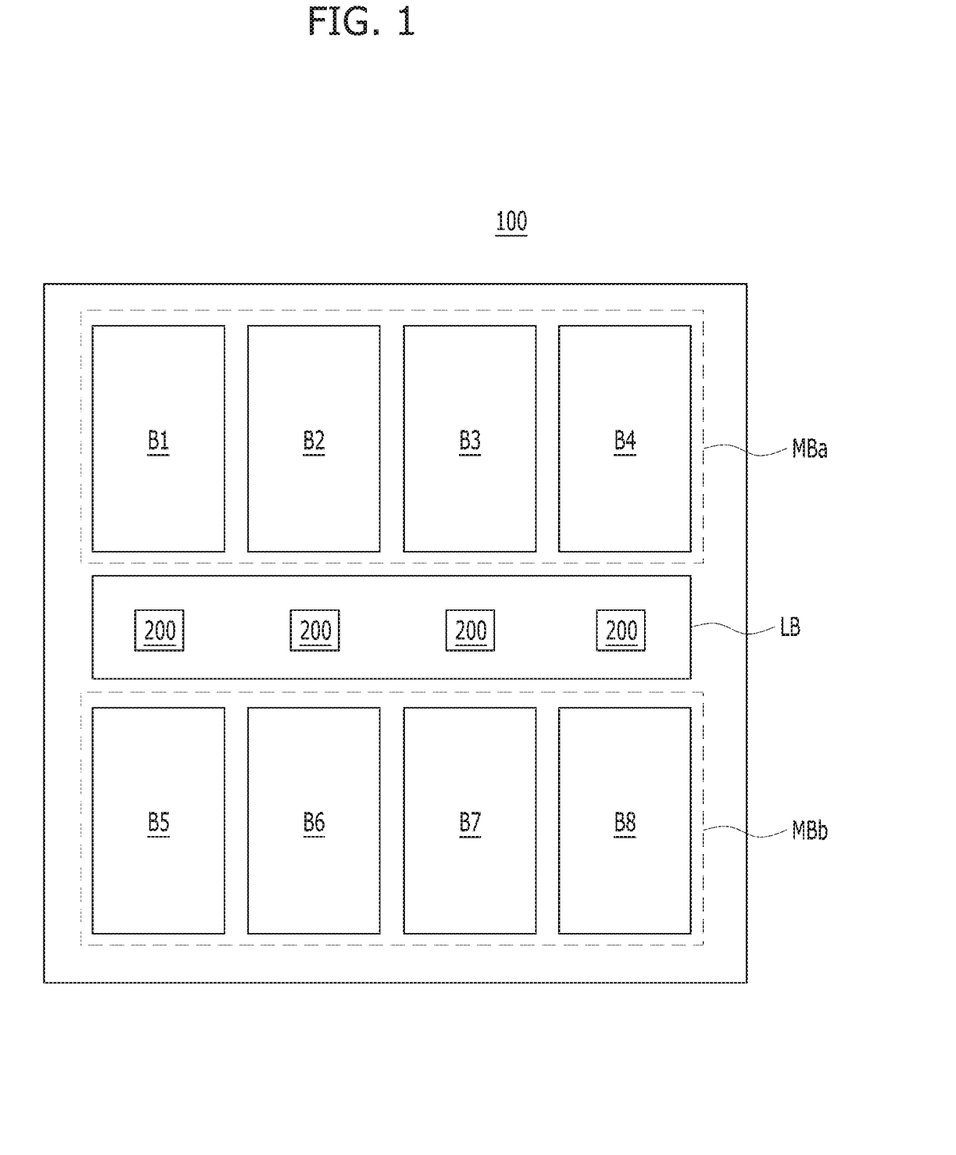
FIG. 1 is a block diagram illustrating a layout of internal circuit blocks of a pseudo-cryogenic semiconductor device in accordance with an embodiment.

FIG. 1 is a block diagram of a layout of internal circuit blocks of a pseudo-cryogenic semiconductor device 100 in accordance with an embodiment. Referring to FIG. 1, the pseudo-cryogenic semiconductor device 100 may include memory blocks MBa and MBb and a logic block LB. The memory blocks MBa and MBb may include a first memory block MBa arranged in an upper area of the pseudo-cryogenic semiconductor device 100 and a second memory block MBb arranged in a lower area of the pseudo-cryogenic semiconductor device 100. The logic block LB may be arranged in an intermediate area between the first memory block MBa and the second memory block MBb. The first memory block MBa may include first to fourth memory banks B1 to B4 juxtaposed with one another in a row direction. The second memory block MBb may include fifth to eighth memory banks B5 to B8 juxtaposed with one another in the row direction. Each of the first to eighth memory banks B1 to B8 may include a plurality of cell blocks, each having a plurality of cell circuits arranged in a matrix form.

For example, when the pseudo-cryogenic semiconductor device 100 is implemented with a dynamic random access memory (DRAM), the cell circuits may include memory cells including a plurality of transistors, a plurality of capacitors, and a plurality of bit lines, driving circuits for controlling the memory cells, and sensing circuits. When the pseudo-cryogenic semiconductor device 100 is implemented with a static random access memory (SRAM), the cell circuits may include memory cells including a plurality of transistors, word lines, and bit lines, driving circuits for controlling the memory cells, and sensing circuits. When the pseudo-cryogenic semiconductor device 100 is implemented with a resistive random access memory (ReRAM), the cell circuits may include memory cells including a plurality of selection elements, a plurality of resistive memory elements, electrodes, word lines, and bit lines, driving circuits for controlling the memory cells, and sensing circuits. When the pseudo-cryogenic semiconductor device 100 is implemented with a magneto-resistive random access memory (MRAM), the cell circuits may include memory cells including a plurality of selection elements, a plurality of magneto-resistive memory elements, electrodes, word lines, and bit lines, driving circuits for controlling the memory cells, and sensing circuits. When the pseudo-cryogenic semiconductor device 100 is implemented with a phase-changeable random access memory (PcRAM), the cell circuits may include memory cells including a plurality of selection elements, a plurality of phase-changeable memory elements, electrodes, word lines, and bit lines, driving circuits for controlling the memory cells, and sensing circuits.

The logic block LB may include logic circuits and a voltage supplier 200, which may include a plurality of voltage suppliers. Each of the plurality of voltage suppliers 200 may provide various voltages to various electrical circuits in the logic block LB and the memory blocks MBa and MBb. For example, the plurality of voltage suppliers 200 may convert an external supply voltage provided from the outside of the pseudo-cryogenic semiconductor device 100 into various internal supply voltages. The internal supply voltages may include a bulk bias voltage Vbb, a word line bias voltage Vbbw, a cell reference voltage Vpp, and a logic reference voltage Vdd.

The bulk bias voltage Vbb may be provided to a bulk region and/or well-regions of transistors. The bulk bias voltage Vbb may be a negative (−) voltage. The word line bias voltage Vbbw may be applied to word lines of cell transistors in the memory blocks MBa and MBb, that is, gate electrodes. The word line bias voltage Vbbw may be a negative (−) voltage such that the cell transistors may stably substantially maintain a turn-off state. The cell reference voltage Vpp may be applied to the transistors in the cell circuits in the memory blocks MBa and MBb. The cell reference voltage Vpp may be boosted from the external supply voltage or the internal supply voltage. The logic reference voltage Vdd may be applied to the transistors in the logic circuits in the logic block LB. The logic reference voltage Vdd may also be boosted from the external supply voltage or the internal supply voltage. In an embodiment, the logic reference voltage Vdd may have a plurality of levels. For example, the logic reference voltage Vdd may include an internal high voltage and an internal low voltage.

In the pseudo-cryogenic semiconductor device 100, the first to eighth memory banks B1 to B8 may receive various internal supply voltages from the adjacent voltage suppliers 200 according to positions. FIG. 1 illustrates eight memory banks B1 to B8 and four voltage suppliers 200; however, a larger number of memory banks and voltage suppliers 200 may be arranged.

Figure 2:
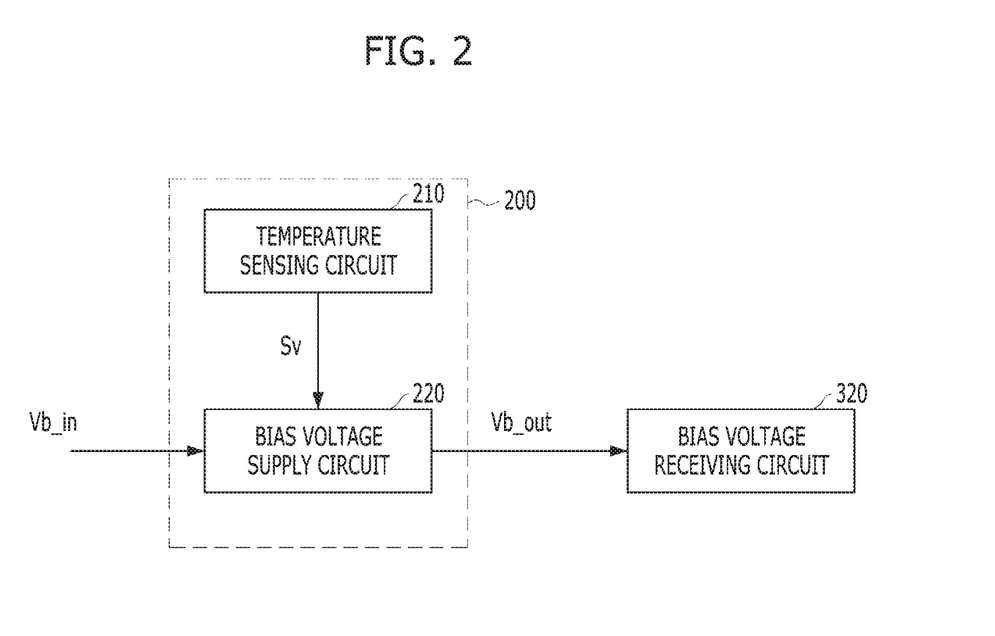
FIG. 2 is a diagram schematically illustrating a voltage supplier of a pseudo-cryogenic semiconductor device in accordance with an embodiment.

FIG. 2 is a diagram schematically illustrating a voltage supply circuit (e.g., the voltage supplier 200 of the pseudo-cryogenic semiconductor device 100 of FIG. 1) in accordance with an embodiment. Referring to FIG. 2, the voltage supplier 200 may include a temperature sensing circuit 210 and a bias voltage supply circuit 220.

The temperature sensing circuit 210 may sense an internal temperature of the pseudo-cryogenic semiconductor device 100, and generate and output various voltage adjustment signals Sv based on the sensed temperature. That is, various types of voltage adjustment signals Sv may be generated and outputted according to a change in the temperature. The voltage adjustment signals Sv may be provided to the bias voltage supply circuit 220. The temperature sensing circuit 210 may include a temperature sensor for sensing the temperature, a signal generator for generating an electrical signal according to the sensed temperature, and a signal output unit for outputting the electrical signal. The temperature sensor may include a pseudo-cryogenic temperature sensor. The temperature sensing circuit 210 may output the voltage adjustment signals Sv when the internal temperature of the pseudo-cryogenic semiconductor device 100 enters the pseudo-cryogenic temperature range. Furthermore, whenever the internal temperature of the pseudo-cryogenic semiconductor device 100 is lowered by a unit temperature (which may be set at 1° K to several ° K) from the upper limit value of the pseudo-cryogenic temperature range, the temperature sensing circuit 210 may generate and output voltage adjustment signals Sv corresponding to sensed temperatures. The voltage adjustment signals Sv may have various levels, e.g., amplitudes, shapes, e.g., waveforms, and/or cycles, e.g., frequencies, according to temperatures sensed by the temperature sensing circuit 210.

The bias voltage supply circuit 220 may convert an input bias voltage Vb_in into an output bias voltage Vb_out according to the voltage adjustment signals Sv, and output the output bias voltage Vb_out. The output bias voltage Vb_out may be a negative (−) voltage. The output bias voltage Vb_out may be provided to a bias voltage receiving circuit 320. The bias voltage receiving circuit 320 may include a bulk of a substrate, well regions of transistors, word lines, or various electrical circuits (e.g., cell or logic circuits) requiring the negative (−) voltage. The output bias voltage Vb_out may have a voltage level different from that of the input bias voltage Vb_in. Accordingly, the bias voltage supply circuit 220 may include a voltage generator or a voltage transformer. In an embodiment, the input bias voltage Vb_in may be a positive (+) voltage. Accordingly, the bias voltage supply circuit 220 may include a negative voltage generation circuit such as a negative (−) charge pump. In another embodiment, the output bias voltage Vb_out may be greater than the input bias voltage Vb_in. In such a case, the bias voltage supply circuit 220 may include a voltage boosting circuit such as a positive (+) charge pump.

Figure 3A:
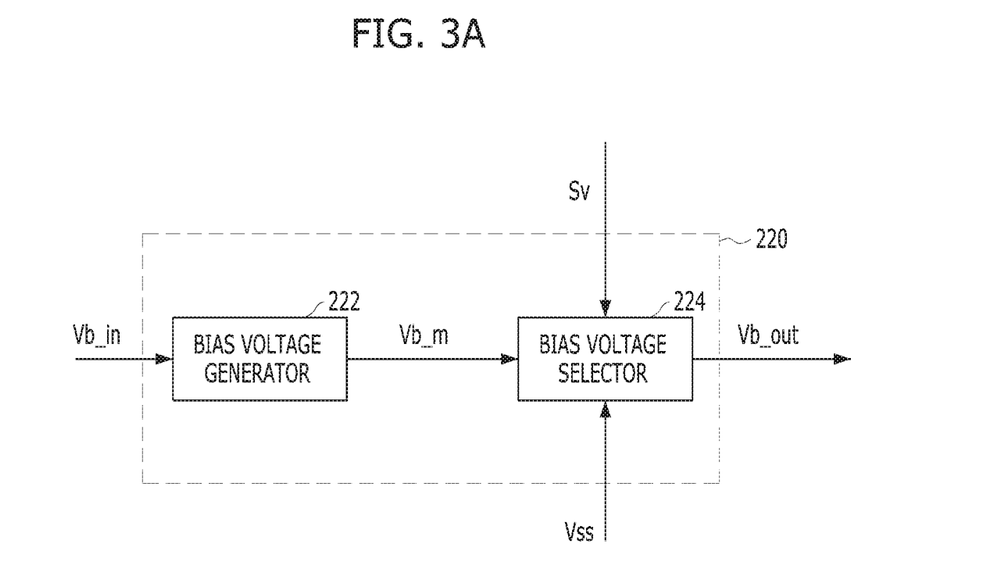
FIG. 3A is a diagram schematically illustrating a bias voltage supply circuit of a pseudo-cryogenic semiconductor device in accordance with an embodiment.

FIG. 3A is a diagram schematically illustrating a bias voltage supply circuit (e.g., the bias voltage supply circuit 220 of the pseudo-cryogenic semiconductor device 100 of FIG. 2) in accordance with an embodiment. Referring to FIG. 3A, the bias voltage supply circuit 220 may include a bias voltage generator 222 and a bias voltage selector 224.

The bias voltage generator 222 may generate an intermediate bias voltage Vb_m. Specifically, the bias voltage generator 222 may convert the input bias voltage Vb_in to the intermediate bias voltage Vb_m, and provide the intermediate bias voltage Vb_m to the bias voltage selector 224. The input bias voltage Vb_in may be the external supply voltage provided from the outside of the pseudo-cryogenic semiconductor device 100 or any of the internal supply voltages generated inside the pseudo-cryogenic semiconductor device 100. The intermediate bias voltage Vb_m may be different from the input bias voltage Vb_in. For example, the intermediate bias voltage Vb_m may be boosted or reduced from the input bias voltage Vb_in. In an embodiment, the intermediate bias voltage Vb_m may be less than the input bias voltage Vb_in. As described above, for example, the input bias voltage Vb_in may be a positive (+) voltage and the intermediate bias voltage Vb_m may be a negative (−) voltage.

The bias voltage selector 224 may receive the voltage adjustment signals Sv, the intermediate bias voltage Vb_m, and a ground voltage Vss. The bias voltage selector 224 may select one of the intermediate bias voltage Vb_m and the ground voltage Vss, and output the selected voltage as the output bias voltage Vb_out. That is, the output bias voltage Vb_out may be a negative (−) voltage or the ground voltage Vss.

Figure 3B:
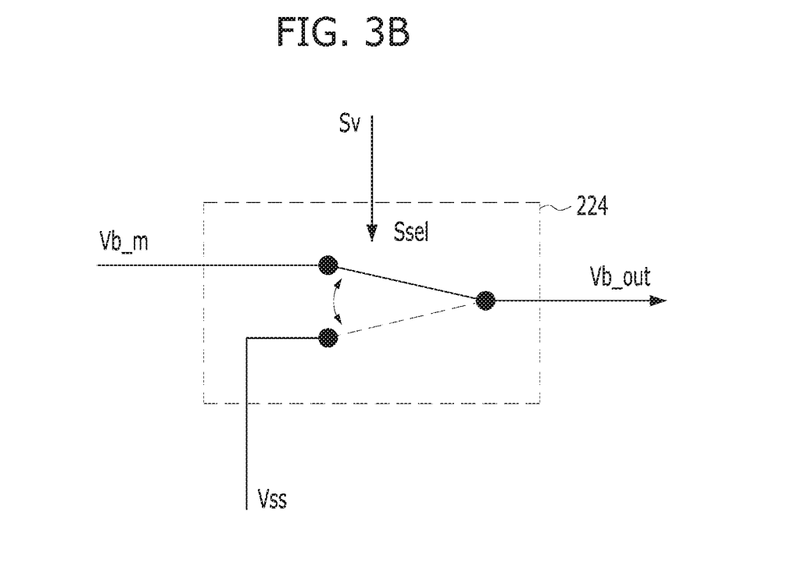
FIG. 3B is a diagram schematically illustrating a bias voltage selector of a pseudo-cryogenic semiconductor device in accordance with an embodiment.

FIG. 3B is a diagram schematically illustrating a bias voltage selector (e.g., the bias voltage selector 224 of the pseudo-cryogenic semiconductor device 100 of FIG. 3A) in accordance with an embodiment. Referring to FIG. 3B, the bias voltage selector 224 may include a selection switch Ssel that selects one of the intermediate bias voltage Vb_m and the ground voltage Vss. Accordingly, the bias voltage selector 224 may select one of the intermediate bias voltage Vb_m and the ground voltage Vss according to the voltage adjustment signals Sv, and output the selected voltage as the output bias voltage Vb_out. That is, the selection switch Ssel may be switched between the intermediate bias voltage Vb_m and the ground voltage Vss.

Figure 4A:
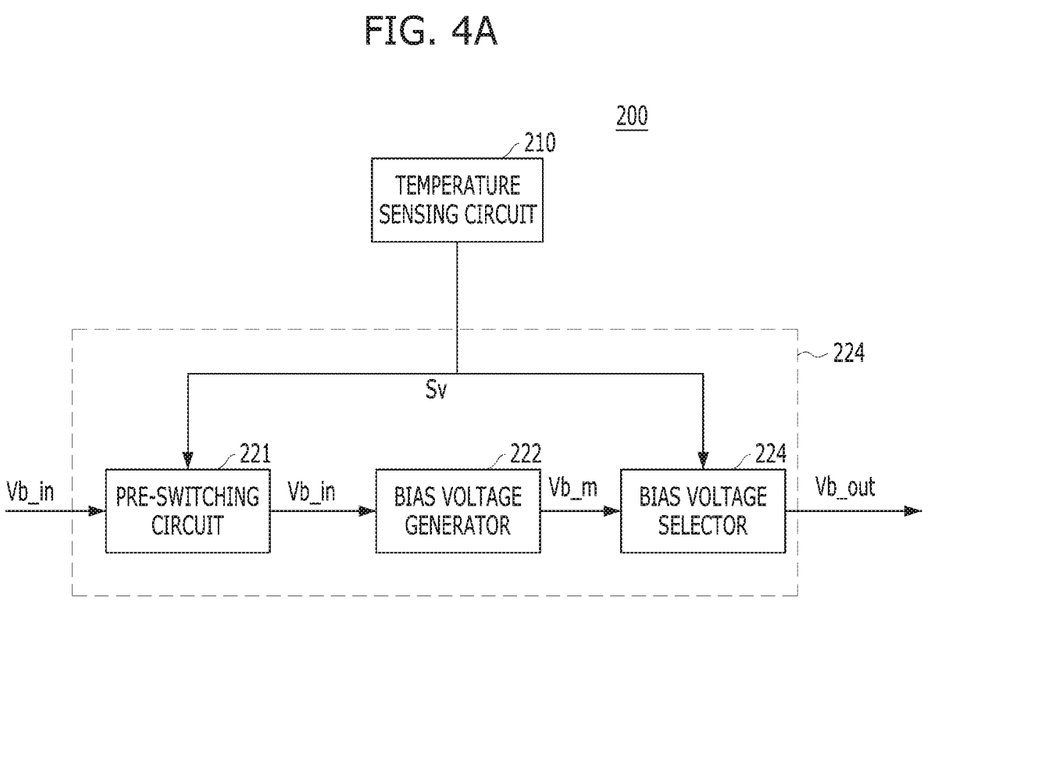
FIG. 4A is a diagram schematically illustrating a voltage supplier of a pseudo-cryogenic semiconductor device in accordance with an embodiment.

FIG. 4A is a diagram schematically illustrating a voltage supply circuit (e.g., the voltage supplier 200 of the pseudo-cryogenic semiconductor device 100 of FIG. 1) in accordance with an embodiment. Referring to FIG. 4A, the voltage supplier 200 may include the temperature sensing circuit 210 and the bias voltage supply circuit 220. The bias voltage supply circuit 220 may include a pre-switching circuit 221, a bias voltage generator 222, and a bias voltage selector 224.

The pre-switching circuit 221 may include an on-off switch that performs an on-off operation according to the voltage adjustment signals Sv. For example, the pre-switching circuit 221 may provide an electrical connection, through which an initial bias voltage Vb_in is provided to the bias voltage generator 222, or interrupt the electrical connection such that the initial bias voltage Vb_in is not provided to the bias voltage generator 222, according to the voltage adjustment signals Sv. The temperature sensing circuit 210, the bias voltage generator 222, and the bias voltage selector 224 may be understood with reference to FIG. 3A and FIG. 3B. The initial bias voltage Vb_in may be the internal supply voltage generated inside the pseudo-cryogenic semiconductor device 100. For example, the initial bias voltage Vb_in may be generated by boosting or reducing the external supply voltage provided from the outside of the pseudo-cryogenic semiconductor device 100. Accordingly, the initial bias voltage Vb_in may be a positive (+) voltage.

In another embodiment, the initial bias voltage Vb_in may be an internal supply voltage generated for the voltage supplier 200. In such a case, the bias voltage generator 222 may be omitted and the initial bias voltage Vb_in may be a negative (−) voltage.

In another embodiment, the pre-switching circuit 221 may be positioned between the bias voltage generator 222 and the bias voltage selector 224. In such a case, the bias voltage generator 222 may include a negative charge pump that converts a positive (+) voltage into a negative (−) voltage.

Figure 4B:
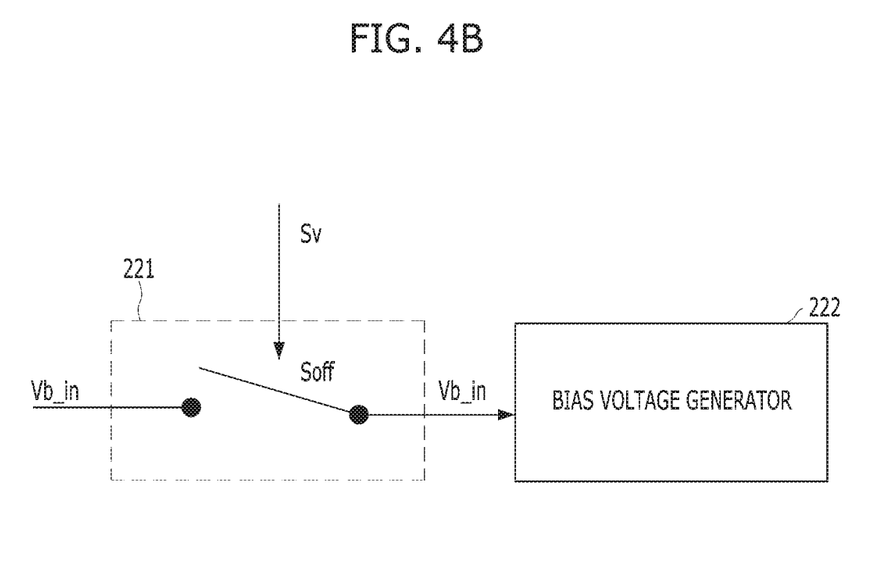
FIG. 4B is a diagram schematically illustrating a pre-switching circuit of a pseudo-cryogenic semiconductor device in accordance with an embodiment.

FIG. 4B is a diagram schematically illustrating a pre-switching circuit (e.g., the pre-switching circuit 221 of the pseudo-cryogenic semiconductor device 100 of FIG. 4A) in accordance with an embodiment. Referring to FIG. 4B, the pre-switching circuit 221 may include an on-off switch Soff. When the on-off switch Soff of the pre-switching circuit 221 is turned on, the initial bias voltage Vb_in may be inputted to the bias voltage generator 222. When the on-off switch Soff of the pre-switching circuit 221 is turned off, the input of the bias voltage generator 222 enters a floating state. That is, the pre-switching circuit 221 may cut off the input of the bias voltage generator 222 such that the initial bias voltage Vb_in is not inputted to the bias voltage generator 222. Accordingly, when the on-off switch Soff of the pre-switching circuit 221 is turned off, the bias voltage generator 222 may be shut down, and the bias voltage selector 224 may cut off the output bias voltage Vb_out or may provide the ground voltage Vss to the bias voltage receiving circuit 320 as the output bias voltage Vb_out.

Figure 5A:
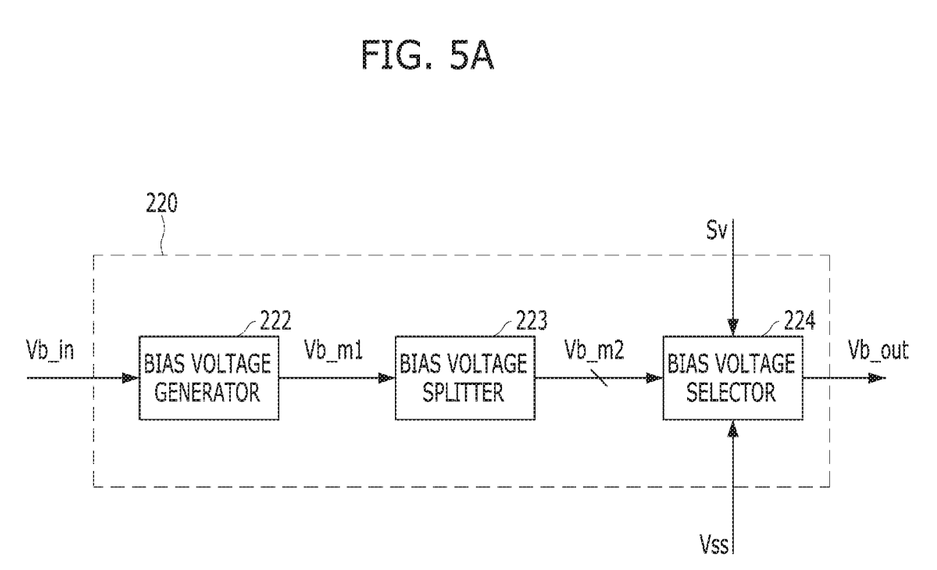
FIG. 5A is a diagram schematically illustrating a bias voltage supply circuit of a pseudo-cryogenic semiconductor device in accordance with an embodiment.

FIG. 5A is a diagram schematically illustrating a bias voltage supply circuit (e.g., the bias voltage supply circuit 220 of the pseudo-cryogenic semiconductor device 100 of FIG. 2) in accordance with an embodiment. Referring to FIG. 5A, the bias voltage supply circuit 220 may include the bias voltage generator 222, a bias voltage splitter 223, and the bias voltage selector 224.

The bias voltage generator 222 may convert the initial bias voltage Vb_in into a first intermediate bias voltage Vb_m1 and provide the first intermediate bias voltage Vb_m1 to the bias voltage splitter 223. The initial bias voltage Vb_in may be one of the external supply voltage provided from the outside of the pseudo-cryogenic semiconductor device 100 and the internal supply voltage generated inside the pseudo-cryogenic semiconductor device 100. In another embodiment, the bias voltage generator 222 may be omitted. For example, the initial bias voltage Vb_in may be directly inputted to the bias voltage splitter 223. In such a case, the first intermediate bias voltage Vb_m1 may be replaced with the initial bias voltage Vb_in.

The bias voltage splitter 223 may split the first intermediate bias voltage Vb_m1 into a plurality of second intermediate bias voltages Vb_m2 having various levels, and provide the second intermediate bias voltages Vb_m2 to the bias voltage selector 224. That is, the first intermediate bias voltage Vb_m1 may have a single voltage level and the second intermediate bias voltages Vb_m2 may have a plurality of voltage levels.

The bias voltage selector 224 may select one of the second intermediate bias voltages Vb_m2 having various levels and the ground voltage Vss according to the voltage adjustment signals Sv, and output the selected voltage as the output bias voltage Vb_out. The output bias voltage Vb_out may be provided to the bias voltage receiving circuit 320 of FIG. 2.

Figure 5B:
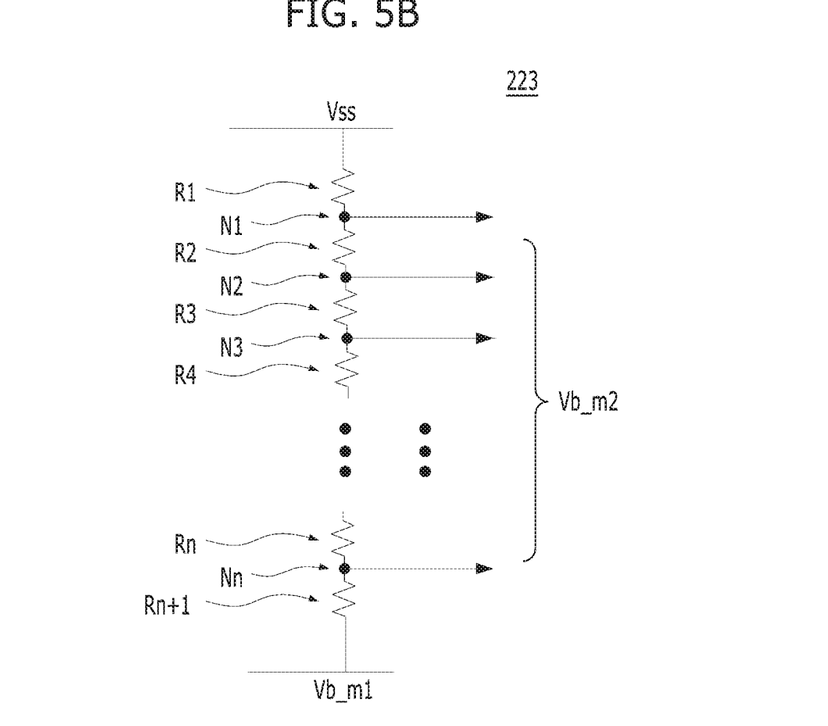
FIG. 5B is a diagram schematically illustrating a bias voltage splitter of a pseudo-cryogenic semiconductor device in accordance with an embodiment.

FIG. 5B is a diagram schematically illustrating a bias voltage splitter (e.g., the bias voltage splitter 223 of the pseudo-cryogenic semiconductor device 100 of FIG. 5A) in accordance with an embodiment. Referring to FIG. 5B, the bias voltage splitter 223 may include a plurality of resistance elements R1 to Rn+1 serially connected to one another between a terminal for the ground voltage Vss and a terminal for the first intermediate bias voltage Vb_m1. The plurality of second intermediate bias voltages Vb_m2 may be pulled out from nodes N1 to Nn among the resistance elements R1 to Rn+1. In an embodiment, since the first intermediate bias voltage Vb_m1 is a negative (−) voltage, the ground voltage Vss is illustrated at an upper side and the first intermediate bias voltage Vb_m1 is illustrated at a lower side.

Figure 5C:
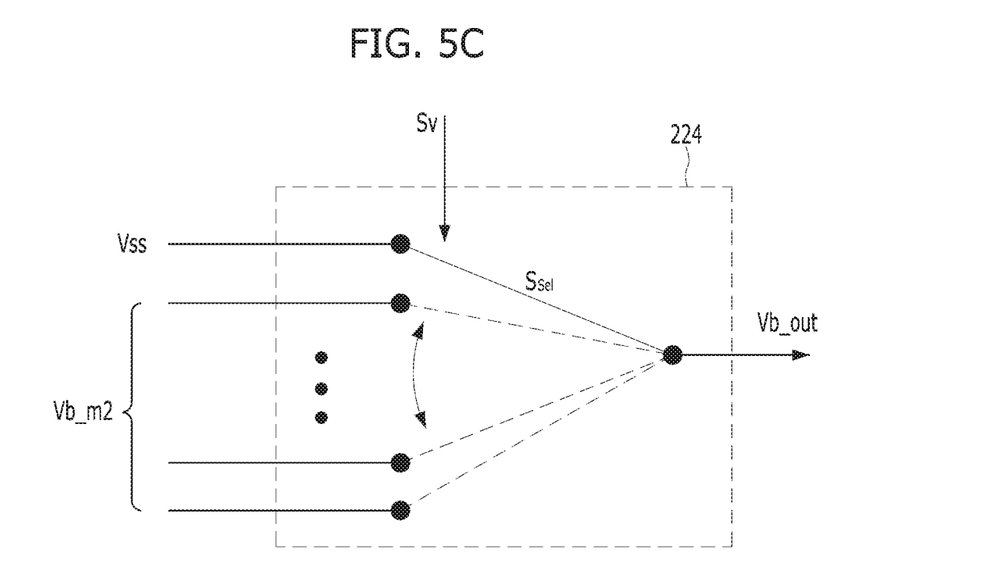
FIG. 5C is a diagram schematically illustrating a bias voltage selector of a pseudo-cryogenic semiconductor device in accordance with an embodiment.

FIG. 5C is a diagram schematically illustrating a bias voltage selector (e.g., the bias voltage selector 224 of the pseudo-cryogenic semiconductor device 100 of FIG. 5A) in accordance with an embodiment. Referring to FIG. 5C, the bias voltage selector 224 may include a selection switch Ssel. The selection switch Ssel may select one of the plurality of second intermediate bias voltages Vb_m2 and the ground voltage Vss. Accordingly, the bias voltage selector 224 may output one of the plurality of second intermediate bias voltages Vb_m2 and the ground voltage Vss as the output bias voltage Vb_out according to the voltage adjustment signals Sv.

Figure 6:
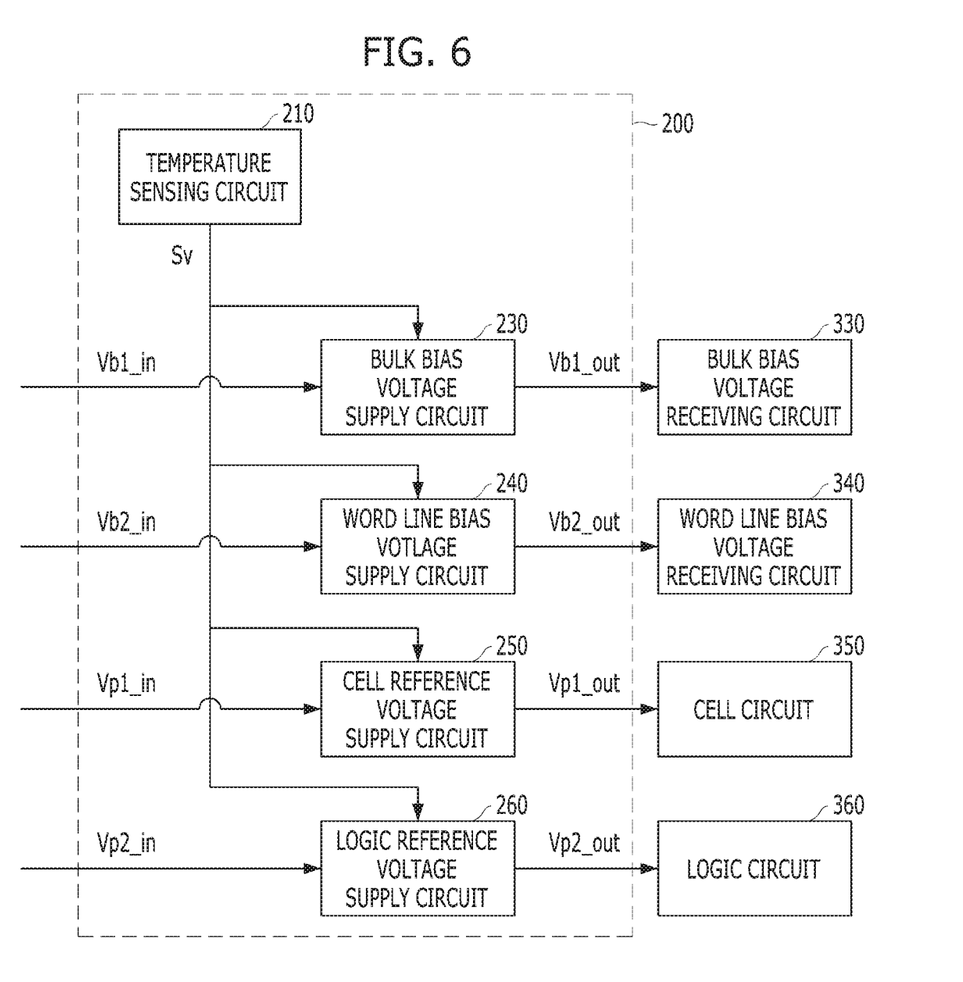
FIG. 6 is a diagram schematically illustrating a voltage supplier of a pseudo-cryogenic semiconductor device in accordance with an embodiment.

FIG. 6 is a diagram schematically illustrating a voltage supply circuit (e.g., the voltage supplier 200 of the pseudo-cryogenic semiconductor device 100 of FIG. 1) in accordance with an embodiment. Referring to FIG. 6, the voltage supplier 200 may include the temperature sensing circuit 210, a bulk bias voltage supply circuit 230, a word line bias voltage supply circuit 240, a cell reference voltage supply circuit 250, and a logic reference voltage supply circuit 260.

The temperature sensing circuit 210 may generate various voltage adjustment signals Sv by sensing the internal temperature of the pseudo-cryogenic semiconductor device 100. The voltage adjustment signals Sv may be provided to the bulk bias voltage supply circuit 230, the word line bias voltage supply circuit 240, the cell reference voltage supply circuit 250, and the logic reference voltage supply circuit 260. In various embodiments, the temperature sensing circuit 210 may include a temperature sensor for sensing the temperature, a signal generation circuit for generating an electrical signal according to the sensed temperature, and a signal output circuit for outputting the generated electrical signal. For example, the temperature sensing circuit 210 may initially generate and output the voltage adjustment signals Sv when the internal temperature of the pseudo-cryogenic semiconductor device 100 enters the pseudo-cryogenic temperature range. Furthermore, within the pseudo-cryogenic temperature range, the temperature sensing circuit 210 may generate and output the voltage adjustment signals Sv according to a variation in the internal temperature of the pseudo-cryogenic semiconductor device 100. As described above, within the pseudo-cryogenic temperature range, the temperature sensing circuit 210 may generate and output various voltage adjustment signals Sv corresponding to a change in a set unit temperature.

The bulk bias voltage supply circuit 230 may convert an initial bulk bias voltage Vb1_in into an output bulk bias voltage Vb1_out according to the voltage adjustment signal Sv. The output bulk bias voltage Vb1_out may be provided to a bulk bias voltage receiving circuit 330, where bulk refers to bulk of the substrate.

The word line bias voltage supply circuit 240 may convert an initial word line bias voltage Vb2_in into an output word line bias voltage Vb2_out according to the voltage adjustment signal Sv. The output word line bias voltage Vb2_out may be provided to a word line bias voltage receiving circuit 340.

The cell reference voltage supply circuit 250 may convert an initial cell reference voltage Vp1_in into an output cell reference voltage Vp1_out according to the voltage adjustment signal Sv. The output cell reference voltage Vp1_out may be provided to cell circuits 350. The cell circuits 350 may include cell transistors, driving transistors, and sensing transistors in the banks B1 to B8 of the memory blocks MBa and MBb.

The logic reference voltage supply circuit 260 may convert an initial logic reference voltage Vp2_in into an output logic reference voltage Vp2_out according to the voltage adjustment signal Sv. The output logic reference voltage Vp2_out may be provided to logic circuits 360. The logic circuits 360 may include logic transistors in the logic block LB.

The bulk bias voltage supply circuit 230, the word line bias voltage supply circuit 240, the cell reference voltage supply circuit 250, and the logic reference voltage supply circuit 260 may operate independently of one another. By way of example, the temperature sensing circuit 210 generates the voltage adjustment signals Sv when the unit temperature changes within the pseudo-cryogenic temperature range. As a result, the output bulk bias voltage Vb1_out, the output word line bias voltage Vb2_out, the output cell reference voltage Vp1_out, and the output logic reference voltage Vp2_out may vary by respective voltage amounts according to the voltage adjustment signals Sv.

For example, when the temperature sensors of the temperature sensing circuit 210 of the voltage suppliers 200 of the pseudo-cryogenic semiconductor device 100 sense entrance to the pseudo-cryogenic temperature range and generate and output the initial voltage adjustment signal Sv, the output voltages of the bulk bias voltage supply circuit 230, the word line bias voltage supply circuit 240, the cell reference voltage supply circuit 250, and the logic reference voltage supply circuit 260 may be initially varied.

Furthermore, within the pseudo-cryogenic temperature range, when the temperature sensing circuit 210 generates and outputs various voltage adjustment signals Sv according to a change in the unit temperature, the output voltages of the bulk bias voltage supply circuit 230, the word line bias voltage supply circuit 240, the cell reference voltage supply circuit 250, and the logic reference voltage supply circuit 260 may be varied step by step. For example, in a case where the unit temperature is set to 5° K, when the temperature sensor of the temperature sensing circuit 210 senses a temperature variation of 5° K within the pseudo-cryogenic temperature range, the temperature sensing circuit 210 may generate and output various voltage adjustment signals Sv according to the sensed temperature variation, so that the output bulk bias voltage Vb1_out may be varied up to about mV/5° K, the output word line bias voltage Vb2_out may be varied up to about 15 mV/5° K, the output cell reference voltage Vp1_out may be varied up to about 20 mV/5° K, and the output logic reference voltage Vp2_out may be varied up to about 10 mV/5° K according to the voltage adjustment signals Sv. These voltage variation amounts are merely examples indicating ranges of variation per unit temperature change of the voltages Vb1_out, Vb2_out, Vp1_out, and Vp2_out in response to the voltage adjustment signals Sv.

The bulk bias voltage supply circuit 230 and the word line bias voltage supply circuit 240 may be understood with reference to the bias voltage supply circuit 220 of FIG. 3A, FIG. 3B, FIG. 4A, FIG. 4B, FIG. 5A, FIG. 5B, and FIG. 5C.

Figure 7A:
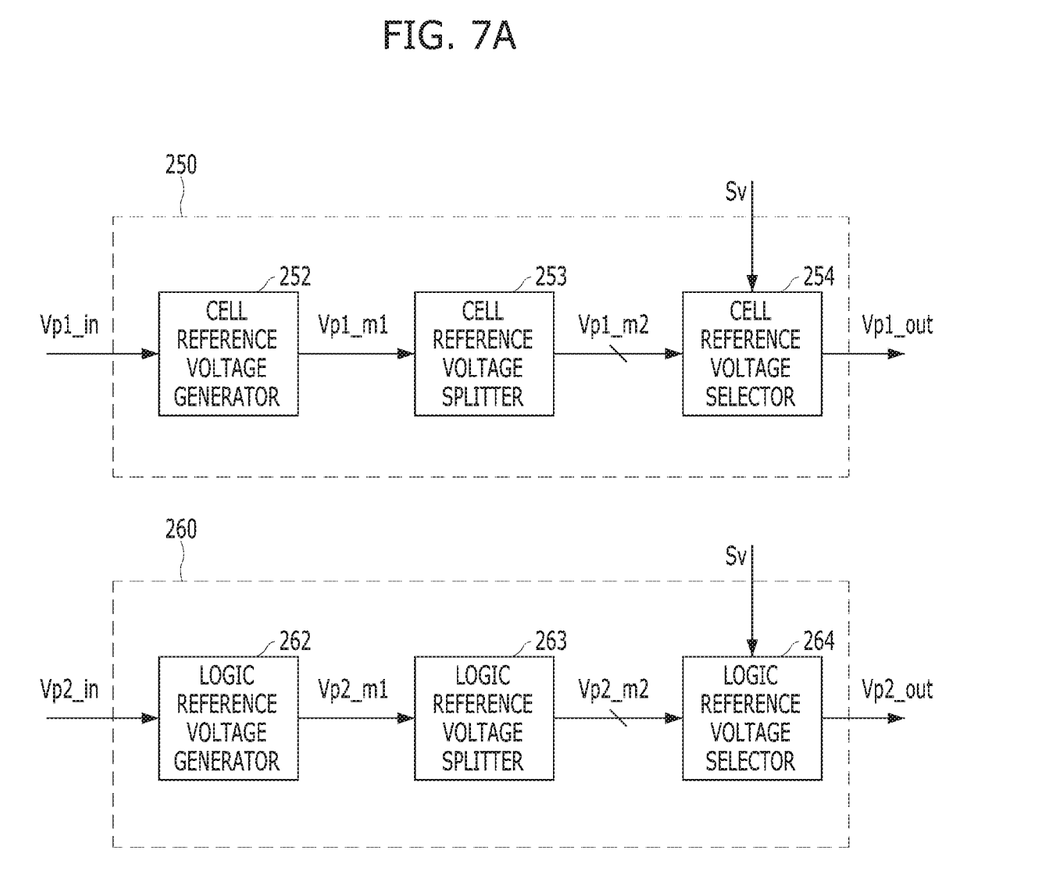
FIG. 7A is a diagram schematically illustrating a cell reference voltage supply circuit and a logic reference voltage supply circuit of a pseudo-cryogenic semiconductor device in accordance with an embodiment.

FIG. 7A is a diagram schematically illustrating a cell reference voltage supply circuit and a logic reference voltage supply circuit (e.g., the cell reference voltage supply circuit 250 and the logic reference voltage supply circuit 260 of the pseudo-cryogenic semiconductor device 100 of FIG. 6) in accordance with an embodiment. Referring to FIG. 7A, the cell reference voltage supply circuit 250 may include a cell reference voltage generator 252, a cell reference voltage splitter 253, and a cell reference voltage selector 254. The logic reference voltage supply circuit 260 may include a logic reference voltage generator 262, a logic reference voltage splitter 263, and a logic reference voltage selector 264.

The cell reference voltage generator 252 may receive an initial cell reference voltage Vp1_in and generate a first intermediate cell reference voltage Vp1_m1. In another embodiment, the cell reference voltage generator 252 may convert the initial cell reference voltage Vp1_in into the first intermediate cell reference voltage Vp1_m1. For example, the first intermediate cell reference voltage Vp1_m1 may be higher than the initial cell reference voltage Vp1_in. In such a case, the cell reference voltage generator 252 may include a voltage boosting circuit such as a positive (+) charge pump. In another embodiment, the cell reference voltage generator 252 may be omitted. That is, the initial cell reference voltage Vp1_in and the first intermediate cell reference voltage Vp1_m1 may be substantially identical to each other.

The cell reference voltage splitter 253 may receive the first intermediate cell reference voltage Vp1_m1 and output a plurality of second intermediate cell reference voltages Vp1_m2 having a plurality of levels. The plurality of second intermediate cell reference voltages Vp1_m2 may be provided to the cell reference voltage selector 254.

The cell reference voltage selector 254 may select one of the plurality of second intermediate cell reference voltages Vp1_m2 according to the voltage adjustment signal Sv, and output the selected voltage as the output cell reference voltage Vp1_out.

The logic reference voltage generator 262 may receive an initial logic reference voltage Vp2_in and generate a first intermediate logic reference voltage Vp2_m1. In another embodiment, the logic reference voltage generator 262 may convert the initial logic reference voltage Vp2_in into the first intermediate logic reference voltage Vp2_m1. For example, the first intermediate logic reference voltage Vp2_m1 may be higher than the initial logic reference voltage Vp2_in. In such a case, the logic reference voltage generator 262 may include a voltage boosting circuit such as a positive (+) charge pump.

In another embodiment, the logic reference voltage generator 262 may be omitted. That is, the initial logic reference voltage Vp2_in and the first intermediate logic reference voltage Vp2_m1 may be substantially identical to each other.

The logic reference voltage splitter 263 may receive the first intermediate logic reference voltage Vp2_m1 and output a plurality of second intermediate logic reference voltages Vp2_m2 having a plurality of levels. The plurality of second intermediate logic reference voltages Vp2_m2 may be provided to the logic reference voltage selector 264.

The logic reference voltage selector 264 may select one of the plurality of second intermediate logic reference voltages Vp2_m2 according to the voltage adjustment signal Sv, and output the selected voltage as the output logic reference voltage Vp2_out.

Figure 7B:
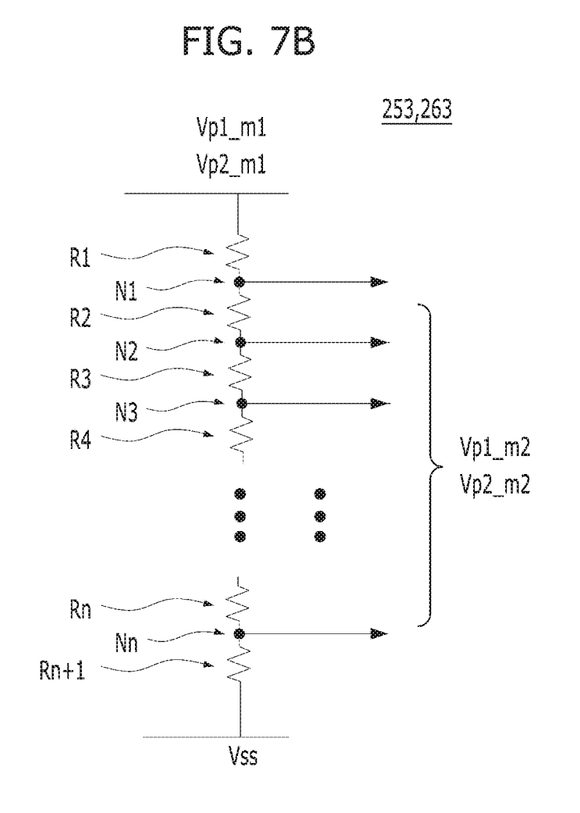
FIG. 7B is a diagram schematically illustrating reference voltage splitters of a pseudo-cryogenic semiconductor device in accordance with an embodiment.

FIG. 7B is a diagram schematically illustrating reference voltage splitters (e.g., the reference voltage splitters 253 and 263 of the pseudo-cryogenic semiconductor device 100 of FIG. 7A) in accordance with an embodiment. Referring to FIG. 7B, each of the reference voltage splitters 253 and 263 may include a plurality of resistance elements R1 to Rn+1 serially connected to one another between terminals for the first intermediate reference voltages Vp1_m1 and Vp2_m1 and a terminal for the ground voltage Vss. The plurality of second intermediate reference voltages Vp1_m2 and Vp2_m2 may be pulled out from nodes N1 to Nn among the resistance elements R1 to Rn+1. In an embodiment, since the first intermediate reference voltages Vp1_m1 and Vp2_m1 are positive (+) voltages, the terminals for the first intermediate reference voltages Vp1_m1 and Vp2_m1 are illustrated at an upper side and the terminal for the ground voltage Vss is illustrated at a lower side.

Figure 7C:
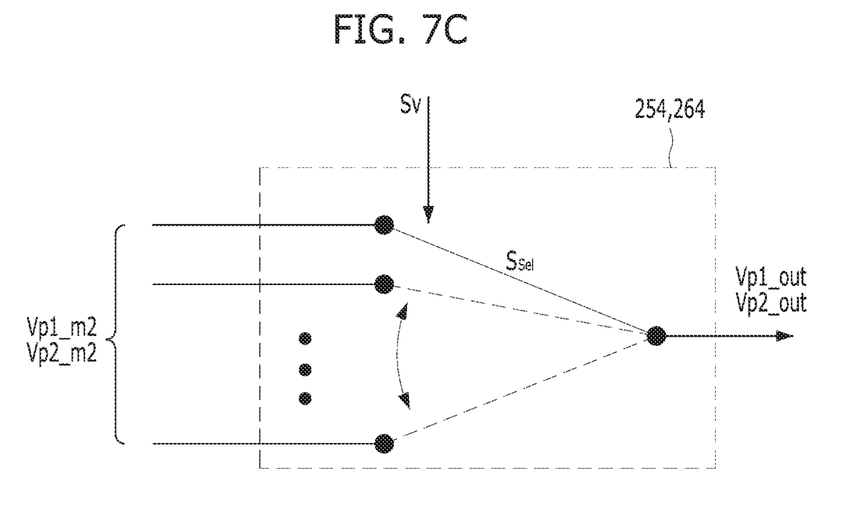
FIG. 7C is a diagram schematically illustrating reference voltage selectors of a pseudo-cryogenic semiconductor device in accordance with an embodiment.

FIG. 7C is a diagram schematically illustrating reference voltage selectors (e.g., the reference voltage selectors 254 and 264 of the pseudo-cryogenic semiconductor device 100 of FIG. 7B) in accordance with an embodiment. Referring to FIG. 7C, the reference voltage selectors 254 and 264 may include a selection switch Ssel. The selection switch Ssel may select one of the plurality of second intermediate reference voltages Vp1_m2 and Vp2_m2 and the ground voltage Vss. Accordingly, the reference voltage selectors 254 and 264 may output one of the plurality of second intermediate reference voltages Vp1_m2 and Vp2_m2 and the ground voltage Vss as the output bias voltage Vp_out according to the voltage adjustment signals Sv.

Figure 8:
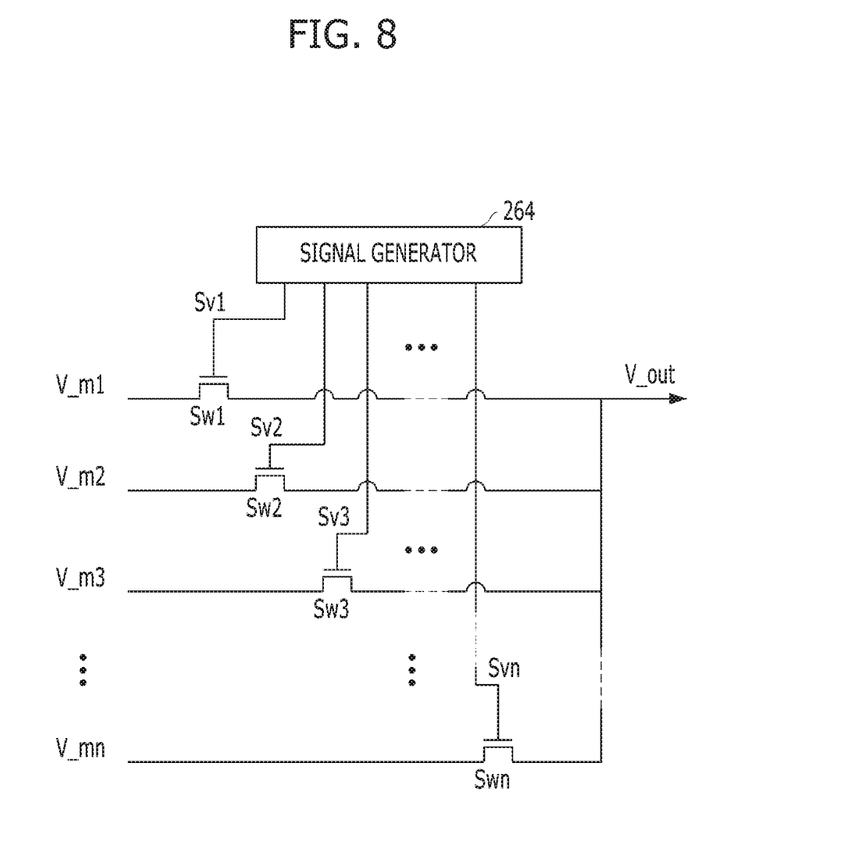
FIG. 8 is a diagram schematically illustrating a voltage selector in accordance with an embodiment.

FIG. 8 is a diagram schematically illustrating a voltage selector in accordance with an embodiment. Referring to FIG. 8, the voltage selector may include a signal generator 400 and a plurality of switching elements Sw1 to Swn. The signal generator 400 may provide voltage adjustment signals Sv1 to Svn to the switching elements Sw1 to Swn. The switching elements Sw1 to Swn may exclusively perform an on-off operation according to the voltage adjustment signals Sv1 to Svn, respectively. That is, when one of the switching elements Sw1 to Swn is turned on, the other switching elements Sw1 to Swn may be turned off. That is, two or more of the switching elements Sw1 to Swn are not turned on at the same time. Accordingly, one of the first to $n^{th}$ intermediate voltages V_m1 to V_mn may be selected and outputted as an output voltage V_out. Although FIG. 8 illustrates that the switching elements Sw1 to Swn include NMOS transistors, the switching elements Sw1 to Swn may include PMOS transistors or combination of NMOS and PMOS transistors. The logic level of each of the voltage adjustment signals Sv1 to Svn applied to operate its associated switching element Sw1 to Swn may be low or high depending on the NMOS/PMOS configuration of the associated switching element. Typically, for an NMOS configured switching element the associated voltage adjustment signal rises from a logic low level to a logic high level to activate that switching element, whereas the reverse transition activates a PMOS configured switching element. The signal generator 400 may be coupled to the bias voltage selector 224 of the bias voltage supply circuit 220, the bulk bias voltage supply circuit 230 and the word line voltage supply circuit 240, as shown in FIGS. 3A, 4A, 5A and 6. Further, the signal generator 400 may be coupled to a cell reference voltage selector 254 of the cell reference voltage supply circuit 250 and a logic reference voltage selector 264 of the logic reference voltage supply circuit 260, as shown in FIG. 7A.

Figure 9:
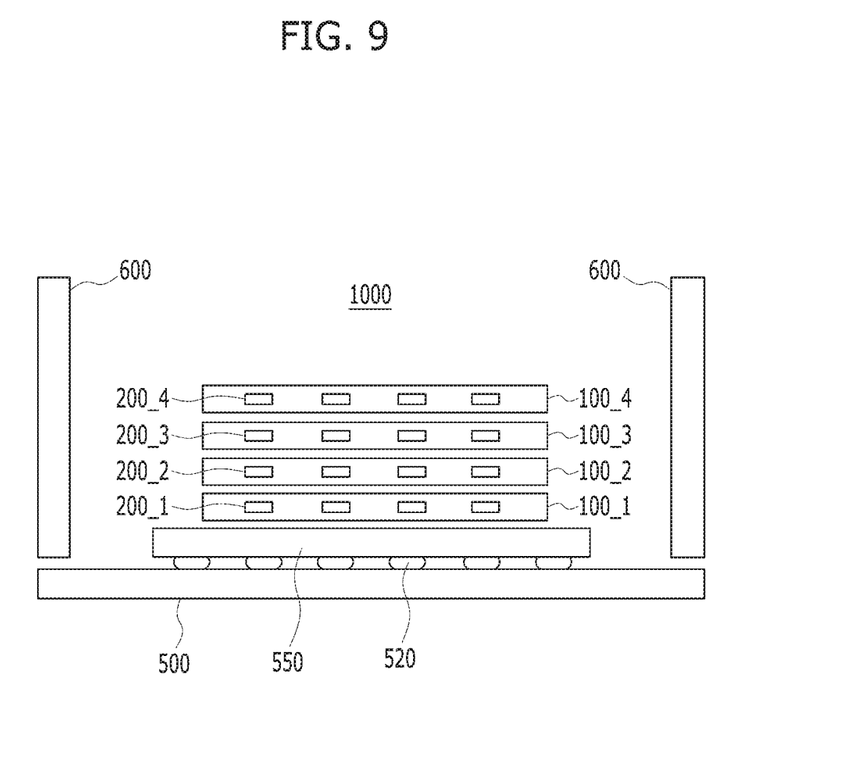
FIG. 9 is a longitudinal sectional view illustrating a semiconductor stack in accordance with an embodiment.

FIG. 9 is a longitudinal sectional view illustrating a semiconductor stack 1000 in accordance with an embodiment. Referring to FIG. 9, the semiconductor stack 1000 may include a module board 550 and a plurality of pseudo-cryogenic semiconductor devices 100_1 to 100_4 stacked on the module board 550. The module board 550 may include a printed circuit board (PCB). The pseudo-cryogenic semiconductor devices 100_1 to 100_4 may be provided therein with a plurality of voltage suppliers 200_1 to 200_4, respectively. The voltage suppliers 200_1 to 200_4 may be the voltage supplier 200 illustrated in FIG. 2 and FIG. 6. The module board 550 may be mounted on a main board 500 by using connectors 520. The connectors 520 may include solder balls or metal bumps. The semiconductor stack 1000 may substantially maintain a pseudo-cryogenic temperature state by a cooling system 600. For example, the cooling system 600 may cool the semiconductor stack 1000 to about 77° K by using a refrigerant such as liquid nitrogen. As described above, since the vaporization point of liquid nitrogen is 77° K (−196° C.), the pseudo-cryogenic temperature range may be particularly defined as about 77° K±7° K, may be extended and defined as about 70° K to about 123° K, and may be further extended and defined as about 70° K to about 173° K. Since the semiconductor devices 100_1 to 100_4 of the semiconductor stack 1000 is configured to perform optimally within the pseudo-cryogenic temperature range, they have excellent electrical, electronic, and commercial advantages.

Although various embodiments have been illustrated and described, it will be apparent to those skilled in the art in light of the present disclosure that various changes and modifications may be made without departing from the spirit and scope of the invention as defined in the following claims.

What is claimed is:

1. A pseudo-cryogenic semiconductor device comprising:
   memory cells having a plurality of transistors; and
   a bulk bias voltage supply circuit configured to provide a bulk bias voltage to be applied to a bulk region of the memory cells,
   wherein the bulk bias voltage supply circuit comprises:
   a first temperature sensing circuit configured to generate a first voltage adjustment signal by sensing a temperature in a range from about 70° K to about 173° K;
   a bulk bias voltage selector configured to receive the first voltage adjustment signal, select one of a first bulk bias voltage and a second bulk bias voltage different from the first bulk bias voltage, and output the selected voltage as the bulk bias voltage; and
   a pre-switching circuit including an on-off switch configured to substantially prevent an initial bulk bias voltage from being provided to the bulk bias voltage selector.

2. The pseudo-cryogenic semiconductor device of claim 1, wherein the first bulk bias voltage is a negative (−) voltage and the second bulk bias voltage is a ground voltage.

3. The pseudo-cryogenic semiconductor device of claim 1, wherein the bulk bias voltage supply circuit further includes a bulk bias voltage generator configured to convert a positive (+) voltage into a negative (−) voltage and provide the converted negative (−) voltage to the bulk bias voltage selector.

4. The pseudo-cryogenic semiconductor device of claim 3, wherein the bulk bias voltage supply circuit further includes a bulk bias voltage splitter positioned between output of the bulk bias voltage generator and input of the bulk bias voltage selector,
the bulk bias voltage splitter splits the initial bulk bias voltage into a plurality of intermediate bulk bias voltages, and
the first bulk bias voltage is one of the intermediate bulk bias voltages.

5. The pseudo-cryogenic semiconductor device of claim 4, wherein the initial bulk bias voltage is a positive (+) voltage and the plurality of intermediate bulk bias voltages are negative (−) voltages.

6. The pseudo-cryogenic semiconductor device of claim 1, further comprising:
a word line bias voltage supply circuit configured to provide a word line bias voltage to be applied to word lines of the memory cells,
wherein the word line bias voltage supply circuit comprises:
a word line bias voltage generator configured to convert a single initial word line bias voltage into a plurality of intermediate word line bias voltages;
a second temperature sensing circuit configured to generate a second voltage adjustment signal by sensing the temperature in the range from about 70° K to about 173° K; and
a word line bias voltage selector configured to receive the second voltage adjustment signal, select one of the intermediate word line bias voltages, and output the selected voltage as the word line bias voltage.

7. The pseudo-cryogenic semiconductor device of claim 6, wherein the plurality of intermediate word line bias voltages are negative (−) voltages.

8. The pseudo-cryogenic semiconductor device of claim 6, wherein the word line bias voltage supply circuit further includes a word line bias voltage generator configured to convert a positive (+) voltage into a negative (−) voltage and provide the converted negative (−) voltage to the word line bias voltage selector.

9. The pseudo-cryogenic semiconductor device of claim 8, wherein the word line bias voltage supply circuit further includes a word line bias voltage splitter positioned between output of the word line bias voltage generator and input of the word line bias voltage selector,
the word line bias voltage splitter splits the initial word line bias voltage into a plurality of intermediate word line bias voltages.

10. The pseudo-cryogenic semiconductor device of claim 1, wherein the second temperature sensing circuit generates second voltage adjustment signals according to a change in a unit temperature set in the temperature range from about 70° K to about 173° K, and
the word line bias voltage selector outputs the intermediate word line bias voltages having multiple levels according to the second voltage adjustment signals.

11. A pseudo-cryogenic semiconductor device comprising:
a memory block having first to fourth memory banks; and
a logic block including first to fourth voltage supply circuits coupled with the first to fourth memory banks respectively to independently supply voltages to the first to fourth memory banks,
wherein each of the first to fourth voltage supply circuits comprises:
a temperature sensing circuit configured to generate voltage adjustment signals by sensing a temperature in a range from about 70° K to about 173° K;
a first bias voltage supply circuit configured to receive the voltage adjustment signals and supply a first bias voltage to a bulk region of the coupled memory banks; and
a first reference voltage supply circuit configured to receive the voltage adjustment signals and supply a first reference voltage to the coupled memory banks,
wherein the first reference voltage supply circuit comprises:
a first reference voltage generator configured to generate a first initial reference voltage having a positive (+) value;
a first reference voltage splitter configured to receive the first initial reference voltage and generate a plurality of first intermediate reference voltages having a positive (+) value; and
a first reference voltage selector configured to select one of the first intermediate reference voltages and outputs the selected voltage as the first reference voltage.

12. The pseudo-cryogenic semiconductor device of claim 11, wherein each of the first to fourth voltage supply circuits further includes a second bias voltage supply circuit configured to receive the voltage adjustment signals and supply a second bias voltage to word lines of the coupled memory banks.

13. The pseudo-cryogenic semiconductor device of claim 12, wherein the first bias voltage supply circuit comprises:
a first bias voltage generator configured to generate a first input bias reference voltage having a negative (−) value; and
a first bias voltage selector configured to select one of the first input bias reference voltage and a ground voltage and output the selected voltage as the first bias voltage.

14. The pseudo-cryogenic semiconductor device of claim 13, wherein the second bias voltage supply circuit comprises:
a second bias voltage generator configured to generate a second input bias voltage having a negative (−) value;
a second bias voltage splitter configured to split the second input bias voltage into a plurality of second intermediate bias voltages; and
a second bias voltage selector configured to select one of the second intermediate bias voltages and output the selected voltage as the second reference voltage.

15. The pseudo-cryogenic semiconductor device of claim 13, wherein the first bias voltage supply circuit further includes a pre-switching circuit configured to shut down the first bias voltage generator by interrupting an internal supply voltage inputted to the first bias voltage generator.

16. The pseudo-cryogenic semiconductor device of claim 11, further comprising:
a second reference voltage supply circuit configured to receive the voltage adjustment signals and supply a second reference voltage to the logic block,
wherein the second reference voltage supply circuit comprises:
a second reference voltage generator configured to generate a second input reference voltage having a positive (+) value;
a second reference voltage splitter configured to receive the second input reference voltage and generate a plurality of second intermediate reference voltages having a positive (+) value; and a second reference voltage selector configured to select one of the second intermediate reference voltages and output the selected voltage as the second reference voltage.

17. A semiconductor stack comprising:

a main board;

a plurality of semiconductor devices mounted on the main board; and a cooling system configured to cool the plurality of semiconductor devices to a temperature in a range from about 70° K to about 173° K, wherein each of the semiconductor devices includes voltage supply circuits that operate independently, and wherein each of the voltage supply circuits includes:

a temperature sensing circuit configured to generate voltage adjustment signals according to the temperature to which plurality of semiconductor devices are cooled;

voltage selectors configured to adjust output voltages according to the voltage adjustment signals; and a pre-switching circuit including an on-off switch configured to substantially prevent an initial bulk bias voltage from being provided to the voltage selectors.

18. The semiconductor stack of claim 17, wherein each of the semiconductor devices comprises:

first to fourth memory banks; and first to fourth voltage supply circuits respectively coupled with the first to fourth memory banks to independently supply voltages to the first to fourth memory banks, wherein each of the first to fourth voltage supply circuits comprises:

a temperature sensing circuit configured to generate and output voltage adjustment signals by sensing the temperature in the range from about 70° K to about 173° K; and a voltage supply circuit configured to receive the voltage adjustment signals from the temperature sensing circuit and supply adjusted voltages to the coupled memory banks.

19. The semiconductor stack of claim 18, wherein the temperature sensing circuit generates voltage adjustment signals according to a change in a unit temperature in the temperature range from about 70° K to about 173° K, and the voltage supply circuit outputs the adjusted voltages having multiple levels according to the voltage adjustment signals.

20. A voltage supplying circuit for a pseudo-cryogenic semiconductor device comprising:

a temperature sensing circuit suitable for sensing a temperature of the semiconductor device and generating a voltage adjustment signal based on the sensed temperature;

a bias voltage generator suitable for receiving an input bias voltage and adjusting the input bias voltage to generate an intermediate bias voltage;

a bias voltage selector suitable for selectively selecting one of the intermediate bias voltage and a ground voltage according to the voltage adjustment signal, and outputting the selected voltage as an output bias voltage, and a pre-switching circuit including an on-off switch configured to substantially prevent an initial bulk bias voltage from being provided to the bias voltage selector.

* * * * *